United States Patent
Kosuge et al.

(10) Patent No.: US 10,483,931 B2
(45) Date of Patent: Nov. 19, 2019

(54) AUDIO DEVICE, SPEAKER DEVICE, AND AUDIO SIGNAL PROCESSING METHOD

(71) Applicant: YAMAHA CORPORATION, Hamamatsu-shi (JP)

(72) Inventors: Katsumasa Kosuge, Hamamatsu (JP); Tomoko Ninomiya, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 0 days.

(21) Appl. No.: 15/919,737

(22) Filed: Mar. 13, 2018

(65) Prior Publication Data

US 2018/0278224 A1 Sep. 27, 2018

(30) Foreign Application Priority Data

Mar. 23, 2017 (JP) .................................. 2017-057559
Jan. 4, 2018 (JP) .................................. 2018-000218

(51) Int. Cl.
| | | |
|---|---|---|
| H03G 3/32 | (2006.01) | |
| H03G 5/16 | (2006.01) | |
| H03G 7/00 | (2006.01) | |
| H03G 9/02 | (2006.01) | |
| H04R 3/04 | (2006.01) | |
| H04R 29/00 | (2006.01) | |

(52) U.S. Cl.
CPC ................ *H03G 3/32* (2013.01); *H03G 5/165* (2013.01); *H03G 7/002* (2013.01); *H03G 9/025* (2013.01); *H04R 3/04* (2013.01); *H04R 29/001* (2013.01); *H04R 2430/01* (2013.01); *H04R 2430/03* (2013.01)

(58) Field of Classification Search
CPC .......... H03G 3/32; H03G 5/165; H03G 7/002; H03G 9/025; H04R 3/04; H04R 29/001; H04R 2430/01; H04R 2430/03
See application file for complete search history.

(56) References Cited

U.S. PATENT DOCUMENTS

| | | | |
|---|---|---|---|
| 5,115,471 A | 5/1992 | Liden | |
| 8,054,993 B1 | 11/2011 | Kreifeldt et al. | |
| 9,214,916 B2 * | 12/2015 | Hashimoto | H03G 9/025 |
| 9,237,392 B2 * | 1/2016 | Asada | H04R 3/04 |
| 9,615,191 B1 * | 4/2017 | Hernandez Garcia | H04R 5/02 |
| 2008/0292121 A1 * | 11/2008 | Yokota | H04R 5/04 381/301 |
| 2010/0158273 A1 | 6/2010 | Cheah et al. | |
| 2011/0135115 A1 * | 6/2011 | Choi | H04S 7/307 381/107 |

(Continued)

FOREIGN PATENT DOCUMENTS

| | | |
|---|---|---|
| JP | 2007104407 A | 4/2007 |
| WO | 0221687 A2 | 3/2002 |

OTHER PUBLICATIONS

Extended European Search Report issued in European Application No. 18162731.6 dated Aug. 9, 2018.

(Continued)

*Primary Examiner* — Mohammad K Islam
(74) *Attorney, Agent, or Firm* — Rossi, Kimms & McDowell LLP

(57) ABSTRACT

An audio device includes: a first detector configured to detect a volume of a first audio signal; and a low-frequency component adjuster configured to generate a second audio signal in which a level of a low-frequency component of the first audio signal is adjusted based on the volume detected by the first detector.

19 Claims, 8 Drawing Sheets

(56) References Cited

U.S. PATENT DOCUMENTS

| | | | |
|---|---|---|---|
| 2012/0014539 A1 | 1/2012 | Inazumi et al. | |
| 2012/0170762 A1* | 7/2012 | Kim | H04R 3/12 381/59 |
| 2012/0288116 A1* | 11/2012 | Saito | H04R 3/00 381/94.2 |
| 2013/0223648 A1* | 8/2013 | Yamada | G10L 19/008 381/98 |
| 2013/0259240 A1* | 10/2013 | Chang | A61B 7/003 381/56 |
| 2013/0336502 A1* | 12/2013 | Jung | H03G 5/165 381/103 |
| 2014/0105417 A1* | 4/2014 | Cheng | H04R 3/04 381/96 |
| 2014/0161278 A1* | 6/2014 | Konno | H04R 5/04 381/94.2 |
| 2015/0212789 A1* | 7/2015 | Jasty | H03G 5/005 381/77 |
| 2015/0304775 A1* | 10/2015 | Fujita | H04R 3/04 381/94.2 |
| 2015/0350786 A1* | 12/2015 | Capp | H03G 5/165 381/103 |
| 2015/0373454 A1* | 12/2015 | Shidoji | G10L 21/013 381/98 |
| 2016/0314777 A1* | 10/2016 | Yu | H04R 29/00 |
| 2017/0097805 A1* | 4/2017 | Aoki | H04S 7/301 |
| 2017/0150260 A1* | 5/2017 | Hashimoto | B06B 1/0238 |
| 2017/0200442 A1* | 7/2017 | Yamabe | G10K 11/178 |
| 2017/0229107 A1* | 8/2017 | Yu | G06F 3/165 |
| 2018/0115818 A1* | 4/2018 | Asada | H04R 3/04 |
| 2018/0242083 A1* | 8/2018 | Lindemann | G10L 21/0208 |
| 2018/0255405 A1* | 9/2018 | Rosenkranz | H04R 25/505 |

OTHER PUBLICATIONS

Office Action issued in European Appln. No. 18162731.6 dated May 16, 2019.

\* cited by examiner

AUDIO DEVICE, SPEAKER DEVICE, AND AUDIO SIGNAL PROCESSING METHOD

CROSS-REFERENCE TO RELATED APPLICATION

This application claims priority from Japanese Patent Application No. 2017-057559, filed on Mar. 23, 2017, and from Japanese Patent Application No. 2018-000218, filed on Jan. 4, 2018. The disclosures of these two applications are incorporated herein by reference in their entirety.

BACKGROUND OF THE INVENTION

Field of the Invention

The present invention relates to an audio device, a speaker device, and an audio signal processing method.

Description of the Related Art

Installation of a speaker device at a location that is limited in size, such as a desktop, necessitates use of a speaker device that is small in size. In contrast to sound output from large speaker devices, sound output from small speaker devices is likely to lack richness in low-frequency sound (bass).

To address this problem, there exists in the art a technique whereby a signal that is input into a speaker device undergoes processing to enhance low-frequency components, and the processed signal is then amplified for output by the speaker device (e.g., refer to Japanese Patent Application Laid-Open Publication No. 2007-104407). More specifically, there is known in the art a speaker device that is provided with a built-in equalizer for raising levels of low-frequency components, and that is also provided with a built-in amplifier.

Multiple devices exist that may serve as a source of audio signals for input into a speaker device, such as a portable player or a networked server, and a user may switch between such audio sources as desired. A volume of sound output from a speaker device is generally controlled by adjusting a knob or the like provided on the speaker device, regardless of an audio source.

A situation is assumed in which a user selects a portable player as an audio source, and the user appropriately sets an output volume by use of the knob provided on the speaker device. In this case, if the user switches the audio source from the portable player to a networked server, it is likely that sound output from the speaker device will lack richness in bass.

SUMMARY OF THE INVENTION

The present invention has been made in view of the above circumstances, and has as an object the provision of a technique that enables output of a bass-rich sound, even when an audio source is changed as described above.

In order to achieve the above objective, an audio device according to one aspect of the invention includes: a first detector configured to detect a volume of a first audio signal; and a low-frequency component adjuster configured to generate a second audio signal in which a level of a low-frequency component of the first audio signal is adjusted based on the volume detected by the first detector.

The present invention may be understood as an audio signal processing method executed in the above-described audio device, or as a speaker device that includes the audio device and a sound output device.

DESCRIPTION OF THE EMBODIMENTS

In the following, embodiments of the invention will be described with reference to the accompanying drawings.

First Embodiment

Figure 1:
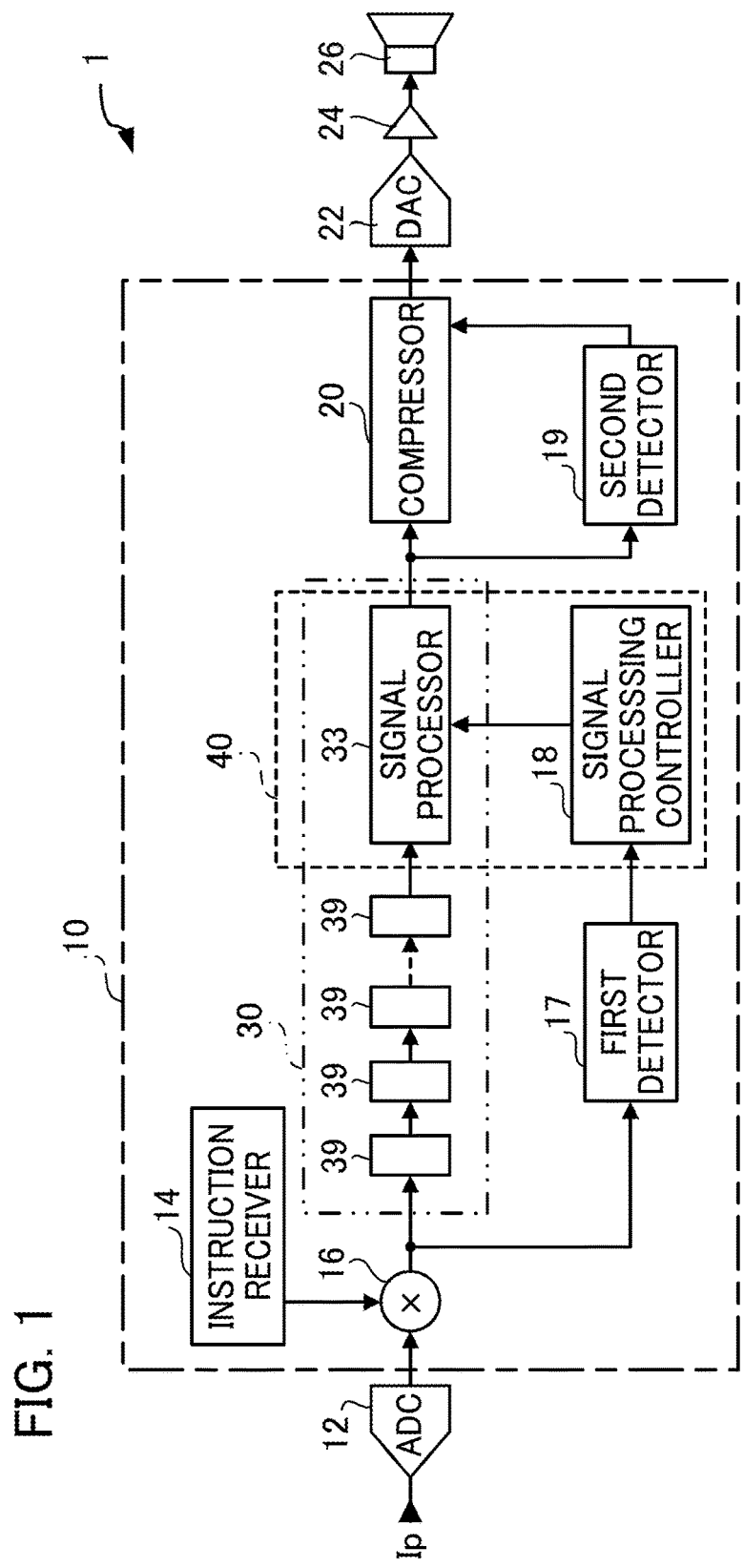
FIG. 1 shows a configuration of a speaker device according to a first embodiment.

FIG. 1 is a block diagram showing a configuration of a speaker device 1 according to the first embodiment. The speaker device 1 outputs sounds based on audio signals Ip that are provided from an audio source, such as a portable player (e.g., a portable media player or a smartphone) or a server. In the first embodiment, the speaker device 1 is assumed to be small in size.

As shown in FIG. 1, the speaker device 1 includes an ADC (Analog to Digital Converter) 12, an audio device 10 that generates second audio signals (adjusted audio signals), a DAC (Digital to Analog Converter) 22, an amplifier 24, and a speaker 26 (sound output device) that outputs sounds based on the second audio signals. The audio device 10 includes an instruction receiver 14, a multiplier 16 (an example of a signal generator), an equalizer 30, a first detector 17, a signal processing controller 18, a second detector 19, and a compressor 20.

The ADC 12 converts the analog audio signals Ip into digital signals and provides the converted signals to the audio device 10 (more specifically, to the multiplier 16).

Although not illustrated, in a case where audio signals Ip are provided in digital format, the audio signals Ip bypass the ADC 12 and are provided to the multiplier 16. In a case where the audio signals Ip are provided from an external device, such as a server, via a network, the audio signals Ip are provided to the multiplier 16 via a network interface (not illustrated). In this specification, the audio signals Ip that are input into the audio device 10 after undergoing processing by the ADC 12 and the audio signals Ip that are input into the audio device 10 bypassing the ADC 12 are generically referred to as input signals.

The instruction receiver 14 is a user-interface that receives from a user an instruction to set a volume of sound output from the speaker device 1. The instruction receiver 14 outputs a coefficient in accordance with the set volume. The instruction receiver 14 may be, for example, a knob or a switch, or may be a receiver of a signal that controls the volume and is transmitted from a remote controller. The instruction receiver 14 outputs coefficient "0.8", for example, to decrease the volume of an input signal, and outputs coefficient "1.2", for example, to increase the volume of an input signal.

The multiplier 16 generates a first audio signal in which the volume of an input signal is adjusted in accordance with an instruction received by the instruction receiver 14. More specifically, the multiplier 16 multiplies an input signal by a coefficient output from the instruction receiver 14 to generate a first audio signal. That is, in other words, the instruction receiver 14 receives an instruction to set the volume of the first audio signal. The multiplier 16 provides the first audio signal to the first detector 17 and to the equalizer 30.

The first detector 17 detects the volume of the first audio signal provided by the multiplier 16, and provides the detection result to the signal processing controller 18. The detection of the volume by the first detector 17 is executed repeatedly for every unit period (e.g., 0.5 or 1 second) along a time-axis. A unit period is a period having a predetermined length. More specifically, the first detector 17 detects, as the volume for the unit period, the maximum amplitude of the first audio signal within the unit period. Alternatively, the first detector 17 may detect an instantaneous value of an amplitude of the first audio signal as the volume of the first audio signal, or may detect an effective value of amplitudes of the first audio signal as the volume of the first audio signal. Here, an effective value refers to the square root of a mean square value of multiplication results obtained by the multiplier 16 per unit period. The functions of the first detector 17 are realized by calculation with a digital signal processor (DSP), for example.

The equalizer 30 adjusts levels of frequency components in the first audio signal. More specifically, the equalizer 30 includes filters 39 that are connected in series and a signal processor 33. Each filter 39 corresponds to a different frequency band and adjusts a level of the corresponding frequency band. After levels of frequency bands in the first audio signal have been adjusted by the filters 39, the first audio signal is provided to the signal processor 33. In this way, the equalizer 30 applies frequency characteristics (described later) to the first audio signal.

The signal processor 33 generates a second audio signal in which a level of a low-frequency component of the first audio signal is adjusted. More specifically, the signal processor 33 in the first embodiment operates in one of multiple states in accordance with a signal provided by the signal processing controller 18. The multiple states include a first state, in which the level of the low-frequency component of the first audio signal is not lowered, and a second state, in which the level of the low-frequency component of the first audio signal is lowered.

The low-frequency component here refers to an audio component with a frequency lower than a predetermined frequency.

The signal processing controller 18 controls the frequency response of the signal processor 33 based on the detection result provided by the first detector 17 (i.e., based on the volume detected by the first detector 17). More specifically, the signal processing controller 18 in the first embodiment determines whether the volume detected by the first detector 17 is higher than a threshold value. In a case where the volume detected by the first detector 17 is higher than the threshold value, the signal processing controller 18 causes the signal processor 33 to operate in the second state. In a case where the volume detected by the first detector 17 is equal to or lower than the threshold value, the signal processing controller 18 causes the signal processor 33 to operate in the first state. In this way, the signal processing controller 18 controls the frequency response of the signal processor 33.

The signal processing controller 18 may be considered as an element that selects one of multiple processing paths included in the signal processor 33. More specifically, in this embodiment, the signal processor 33 includes two processing paths. One is a first processing path (which corresponds to the first state) in which the level of the low-frequency component of the first audio signal is not lowered, and the other is a second processing path (which corresponds to the second state) in which the level of the low-frequency component of the first audio signal is lowered. The signal processing controller 18 controls the frequency response of the signal processor 33 by selecting one of the two processing paths.

The functions of the signal processing controller 18 may be realized by calculation with the DSP, for example, or may be realized by use of a comparator.

Figure 2:
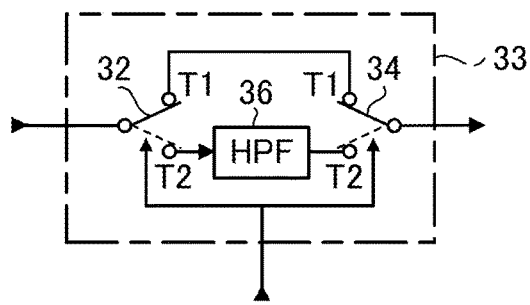
FIG. 2 shows a configuration of a signal processor in the first embodiment.

With reference to FIG. 2, details of the signal processor 33 will now be described. FIG. 2 shows an exemplary configuration of the signal processor 33. As shown in the figure, the signal processor 33 includes single-pole double-throw switches 32 and 34, and a high-pass filter (HPF) 36 that lowers the level of the low-frequency component of the first audio signal. In this embodiment, the signal processor 33 does not process the first audio signal with the HPF 36 in the first state, but does process the first audio signal with the HPF 36 in the second state. More specifically, when the signal processor 33 operates in the first state, the signal processor 33 does not input the first audio signal into the HPF 36, and the first audio signal is output as a second audio signal without undergoing processing by the HPF 36 (i.e., the first audio signal that has passed through the first processing path is output as the second audio signal). When the signal processor 33 operates in the second state, the signal processor 33 inputs the first audio signal into the HPF 36, and the first audio signal that has undergone the processing by the HPF 36 is output as the second audio signal (i.e., the first audio signal that has passed through the second processing path is output as the second audio signal).

Whether the signal processor 33 processes the first audio signal with the HPF 36 or not is switched by the switches 32 and 34. The switches 32 and 34 each have a common connection terminal, a terminal T1, and a terminal T2. The HPF 36 has an input terminal and an output terminal. The terminal T1 of the switch 32 is connected to the terminal T1 of the switch 34. The terminal T2 of the switch 32 is connected to the input terminal of the HPF 36, and the terminal T2 of the switch 34 is connected to the output terminal of the HPF 36.

Selection of a connection state of the terminals T1 and terminals T2 of the switches 32 and 34 is controlled by the signal processing controller 18 as follows. In a case where the volume detected by the first detector 17 is higher than the threshold value, the signal processing controller 18 causes each of the switches 32 and 34 to select their terminal T2 (the second state). In a case where the volume detected by the first detector 17 is equal to or lower than the threshold value, the signal processing controller 18 causes each of the switches 32 and 34 to select their terminal T1 (the first state).

As will be understood from the description above, the signal processor 33 and the signal processing controller 18 together serve as a low-frequency component adjuster 40 (refer to FIG. 1) that generates the second audio signal in which the level of the low-frequency component of the first audio signal is adjusted based on the volume detected by the first detector 17.

In FIG. 1, the equalizer 30 and the low-frequency component adjuster 40 are each shown in functional block diagram form. In reality, however, each of the equalizer 30 and the low-frequency component adjuster 40 is realized by calculation with the DSP.

The second detector 19 detects the volume of the second audio signal output by the signal processor 33 (i.e., the volume of an output audio signal from the common connection terminal of the switch 34) in a manner similar to the first detector 17, and provides the detection result to the compressor 20. The functions of the second detector 19 can be realized by calculation with the DSP, for example.

The compressor 20 compresses a dynamic range of the second audio signal in accordance with levels of the second audio signal, and provides the compressed second audio signal to the DAC 22. More specifically, the compressor 20 compresses the dynamic range of the second audio signal in accordance with the volume detected by the second detector 19. In more detail, the higher the volume detected by the second detector 19, the greater the ratio of compression of the dynamic range by the compressor 20. The dynamic range here is a ratio between the maximum volume and the minimum volume of the second audio signal.

The DAC 22 converts the provided audio signal into an analog audio signal. The amplifier 24 amplifies the analog-converted audio signal by a set amplification factor and outputs the amplified audio signal to the speaker 26. The speaker 26 converts the audio signal amplified by the amplifier 24 into sound and outputs the sound, which is vibrations of the air.

The functions realized by calculation with the DSP in the above description (the first detector 17, the filters 39, the signal processor 33, the signal processing controller 18, and the second detector 19) may each be realized by a central processing unit (CPU) executing a program stored in a storage unit (not illustrated in the figures), instead of by calculation with the DSP.

Next, operations of the speaker device 1 in the first embodiment will be described.

Sound that is output from the small speaker device 1 without undergoing processing is likely to lack richness in bass. Thus, processing is performed using filters 39 to raise the level of low-frequency components; more specifically, the level of a frequency at around 70 Hz is raised. Thereafter, processing as described below is performed.

Figure 3:
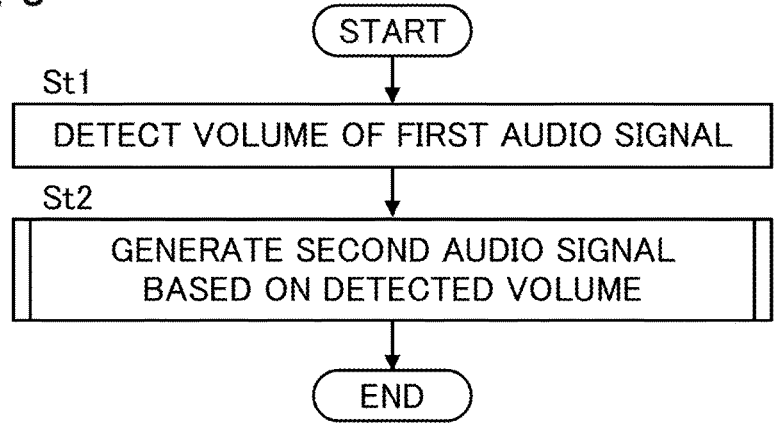
FIG. 3 is a flowchart showing an overview of processing to generate a second audio signal.

FIG. 3 is a flowchart showing an overview of processing by which the audio device 10 generates a second audio signal. At step St1, the first detector 17 detects the volume of a first audio signal. At step St2, the low-frequency component adjuster 40 adjusts, based on the detected volume, the level of a low-frequency component of the first audio signal to generate a second audio signal. The processing at step St1 and step St2 is performed repeatedly for each unit period.

Figure 4:
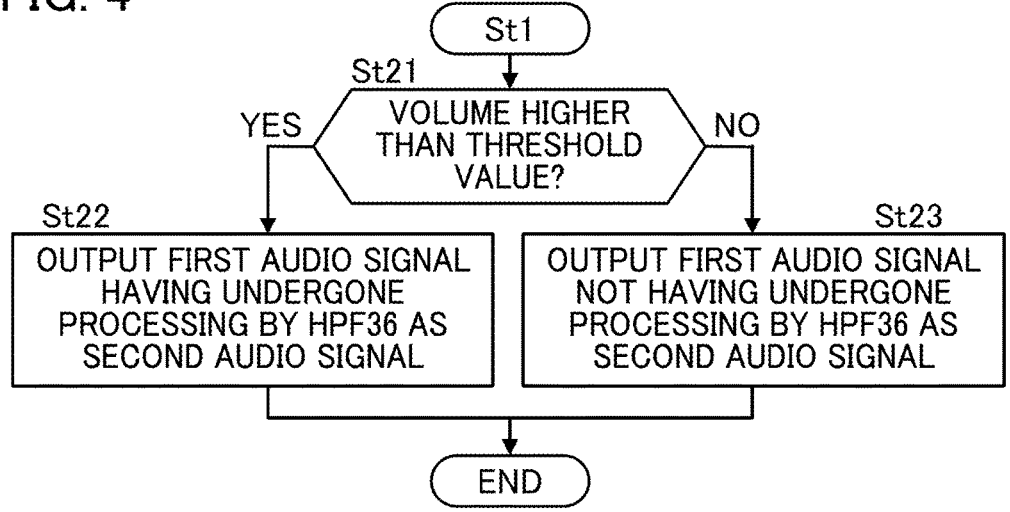
FIG. 4 is a flowchart showing exemplary processing by a low-frequency component adjuster.

With reference to FIG. 4, specifics of processing performed by the low-frequency component adjuster 40 will be described. FIG. 4 is a flowchart showing exemplary processing performed by the low-frequency component adjuster 40. In a case where the signal processing controller 18 determines that the volume detected by the first detector 17 is higher than the threshold value (St21:YES), that is, in a case where the volume of sound to be output from the speaker 26 is relatively high, the signal processor 33 outputs, as the second audio signal, a first audio signal that has undergone the processing by the HPF 36 (St22). In other words, the signal processing controller 18 causes each of the switches 32 and 34 to select their terminal T2, whereby the signal processor 33 operates in the second state.

Figure 5:
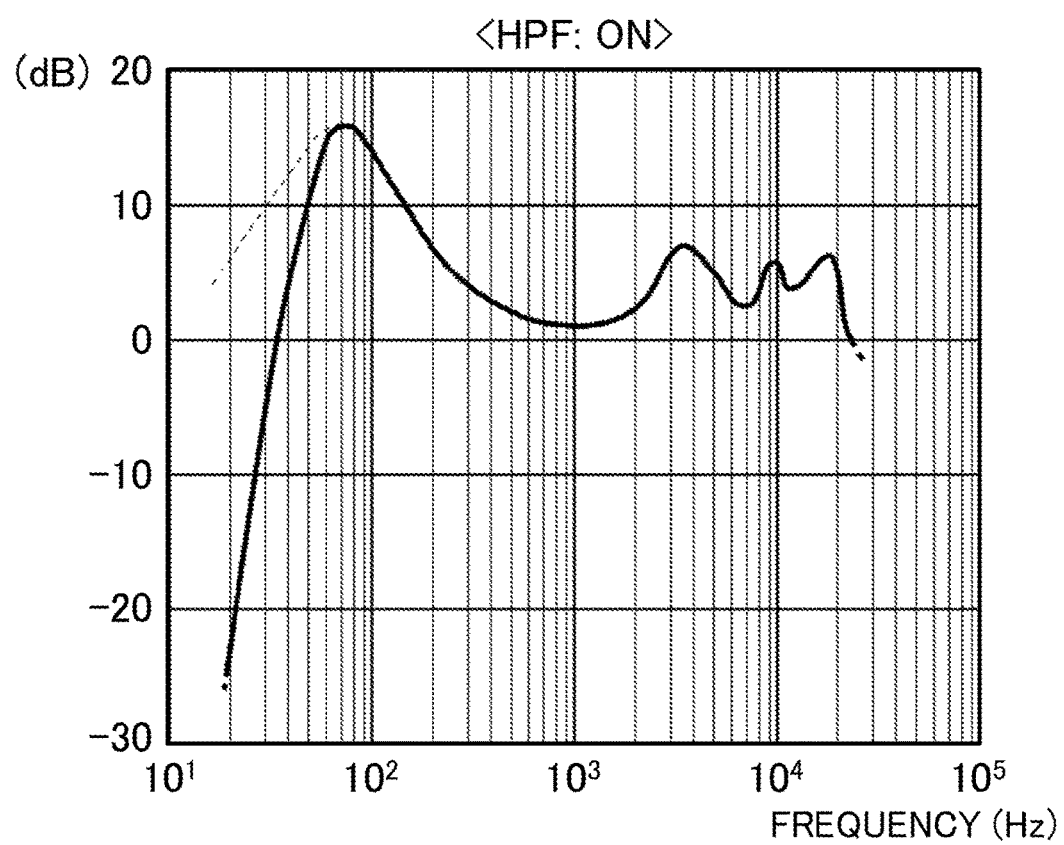
FIG. 5 shows exemplary frequency characteristics of a second audio signal.

FIG. 5 is a diagram showing exemplary frequency characteristics of a second audio signal that is generated in a case where the first audio signal undergoes the processing by the HPF 36. The cut-off frequency of the HPF 36 is, for example, around 50 Hz. Accordingly, as shown in FIG. 5, a level of a frequency band containing frequencies equal to or lower than 50 Hz is greatly reduced as compared to that of a second audio signal generated without the first audio signal undergoing the processing by the HPF 36 (illustrated by a dashed line).

The frequency characteristics shown in FIG. 5 may be said to show input-output characteristics of the equalizer 30 when the signal processor 33 operates in the second state. As shown in FIG. 5, for a frequency band containing frequencies equal to or higher than the cut-off frequency, the line showing the frequency characteristics is not flat. More specifically, there are peaks at around 70 Hz, at around 3000 Hz, and at around 10000 Hz. Such peaks result from an equalizing process that is performed on the first audio signal when the first audio signal passes through the equalizer 30.

In a case where the volume of the first audio signal is higher than the threshold value, the first audio signal undergoes the processing by the HPF 36. Accordingly, the levels of the low-frequency components in the resultant second audio signal are reduced. However, since the volume of sound output from the speaker 26 is set to be high, the reduction in richness in bass is not readily perceivable by the user.

In a case where the volume detected by the first detector 17 is determined to be equal to or lower than the threshold value (St21:NO in FIG. 4), that is, in a case where the volume of sound to be output from the speaker 26 is relatively low, the signal processor 33 outputs, as the second audio signal, a first audio signal that has bypassed the HPF 36 and thus does not undergo the processing by the HPF 36 (St23 in FIG. 4). In other words, the signal processing controller 18 causes each of the switches 32 and 34 to select their terminal T1, whereby the signal processor 33 operates in the first state.

Figure 6:
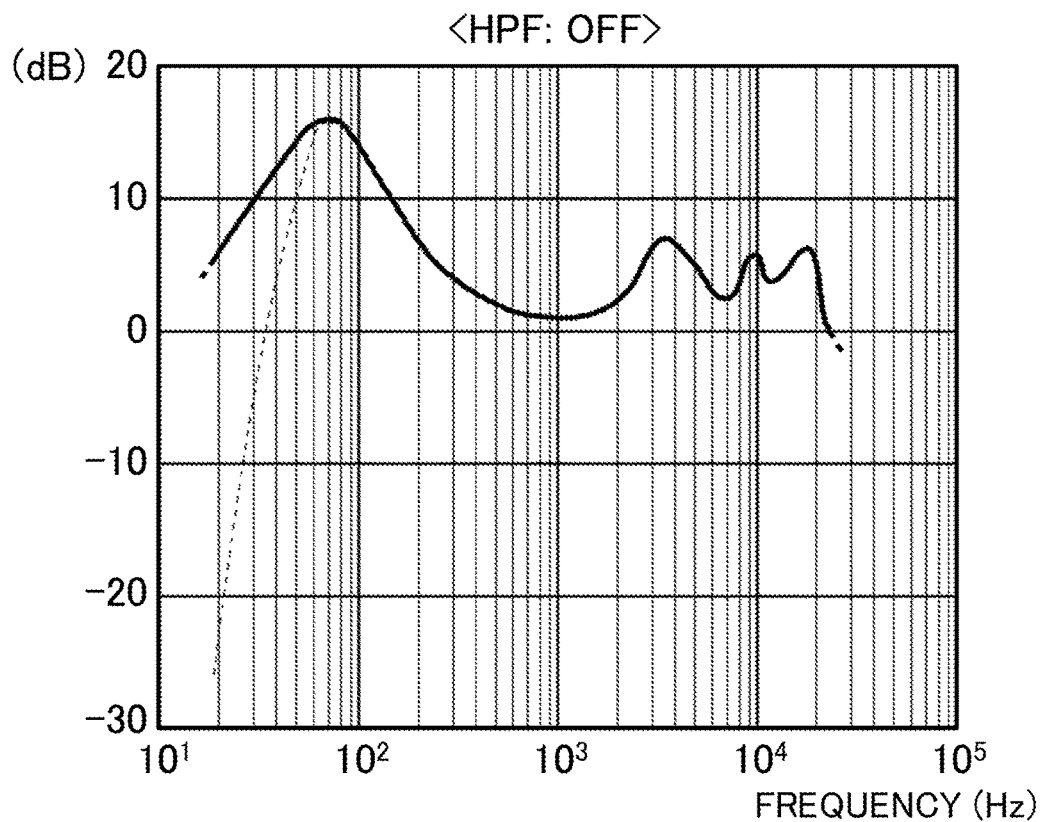
FIG. 6 shows exemplary frequency characteristics of a second audio signal.

FIG. 6 is a diagram showing exemplary frequency characteristics of a second audio signal that is generated in a case where the first audio signal does not undergo the processing by the HPF 36. In FIG. 6, the level of a frequency band containing frequencies that are equal to or lower than 50 Hz is high as compared to that shown in the example of FIG. 5. As will be understood from this example, in a case where the volume of the first audio signal is not higher than the threshold value, the level of the low-frequency components is not reduced. Accordingly, even when the volume of sound output by the speaker 26 is set to be relatively low, richness in bass will be maintained.

In the speaker device 1 in the first embodiment, depending on whether the volume of the first audio signal is higher than the threshold value, wherein the volume of the first audio signal has been adjusted in accordance with an instruction received by the instruction receiver 14, whether the HPF 36 processes the first audio signal or not is switched. In this way, even when the volume of sound output from the speaker 26 is set to be relatively low, a bass-rich sound can be output, regardless of the source of the sound.

For example, in a case where the user connects a portable player to the speaker device 1 and sets the volume via the instruction receiver 14, and then changes the audio source from the portable player to a networked server, since the level of an audio signal output from the server cannot be controlled, the volume of a sound output from the speaker 26 may differ between a case where the portable player is selected as the audio source and a case where the server is selected as the audio source. In this embodiment, the first detector 17 determines whether to adjust the level of the low-frequency component based on a multiplication result by the multiplier 16, namely, based on the volume of the first audio signal that has been adjusted in accordance with an instruction received by the instruction receiver 14. In this way, even when the volume of sound output from the speaker 26 becomes low as a result of a change in the audio source, a bass-rich sound can be output.

Second Embodiment

A second embodiment of the invention will now be described. In the second embodiment and in the modifications described below as examples, elements in common with those in the first embodiment in both effect and function will be denoted by the same reference signs as those used to denote like elements in the first embodiment, and detailed explanations thereof will be omitted, as appropriate.

Figure 7:
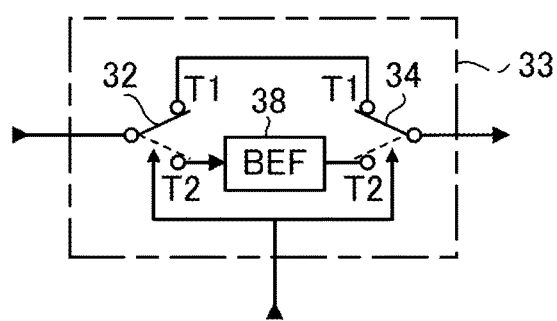
FIG. 7 shows a configuration of a signal processor according to a second embodiment.

FIG. 7 is a block diagram showing a configuration of a signal processor 33 in the second embodiment.

The signal processor 33 in the second embodiment differs from the signal processor 33 in the first embodiment shown in FIG. 1 in that the signal processor 33 in the second embodiment includes, instead of the HPF 36, a band-elimination filter (BEF) 38 that lowers the level of a low-frequency component of a first audio signal. The BEF 38 lowers the level of a particular frequency band. In this example, the midpoint of the particular frequency band is set at around 60 Hz. The configuration of the speaker device 1 in the second embodiment is similar to that of the speaker device 1 described in the first embodiment, except for the configuration of the signal processor 33.

Figure 8:
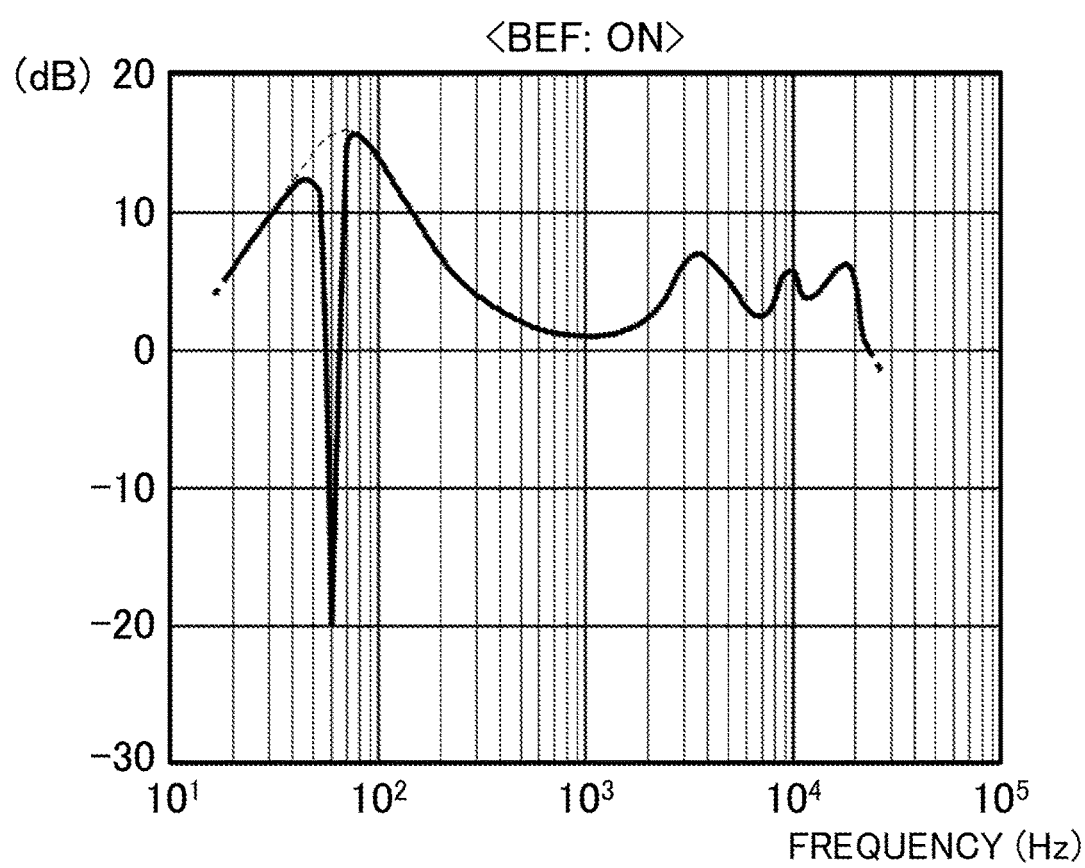
FIG. 8 shows exemplary frequency characteristics of a second audio signal.

FIG. 8 shows exemplary frequency characteristics of a second audio signal that is generated in a case where the first audio signal has undergone processing by the BEF 38.

In FIG. 8, the level of a frequency band at around 60 Hz is greatly reduced as a result of the processing by the BEF 38. However, since the volume of sound output by the speaker 26 is high, any reduction in richness in bass will not be readily perceivable by the user. The frequency characteristics shown in FIG. 8 are substantially the same as those shown in FIG. 5, with the exception of the reduction in the level of the frequency at around 60 Hz as a result of the processing by the BEF 38.

Figure 9:
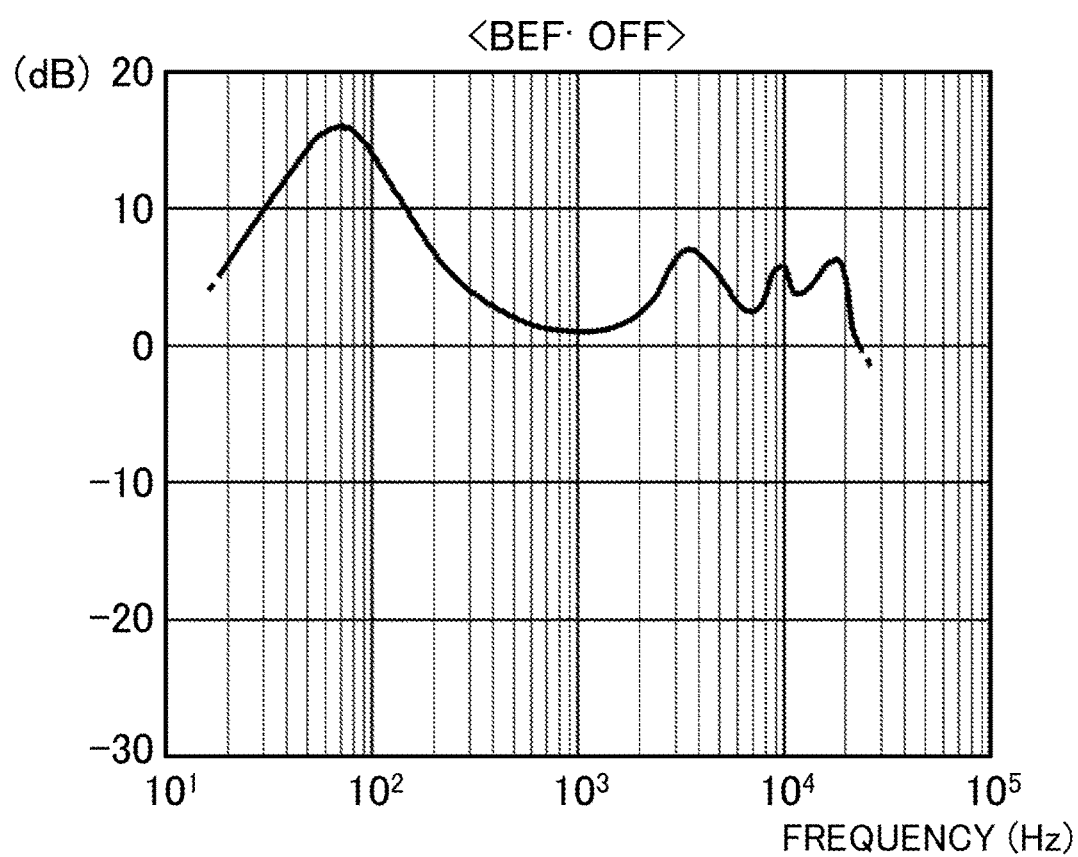
FIG. 9 shows exemplary frequency characteristics of a second audio signal.

FIG. 9 shows exemplary frequency characteristics of a second audio signal that is generated in a case where the first audio signal does not undergo the processing by the BEF 38.

In FIG. 9, there is no reduction in the level of frequency at around 60 Hz resulting from the processing by the BEF 38. Accordingly, even when the volume of sound output from the speaker 26 is relatively low, richness in bass will be maintained. The frequency characteristics shown in FIG. 9 are substantially the same as those shown in FIG. 6.

In this way, similarly to the case in the first embodiment, the speaker device 1 in the second embodiment is able to output a bass-rich sound, regardless of the source of the sound, and even when the volume of sound output from the speaker 26 is relatively low.

Modifications

The present invention is not limited to the first and second embodiments described above. The invention may be applied or modified in a variety of ways as described below. Two or more modes freely selected from the following application or modification modes may be combined as appropriate.

Modification 1

In the first and second embodiments, the signal processing controller 18 controls the frequency response of the signal processor 33 using a single threshold value. Alternatively, the signal processing controller 18 may use multiple threshold values. More specifically, in the above-described embodiments, the signal processing controller 18 determines whether the detected volume is higher than the threshold value. Here, the determination may be made based on hysteresis characteristics. For example, in a case where the volume becomes lower than a first threshold value while the volume is decreasing, the signal processing controller 18 may cause the signal processor 33 to operate in the first state, and in a case where the volume becomes higher than a second threshold value while the volume is increasing, the signal processing controller 18 may cause the signal processor 33 to operate in the second state. The first threshold value here is set to be lower than the second threshold value.

In the above configuration, in a case where the volume of the first audio signal fluctuates around a single threshold value, frequent change in the frequency response of the signal processor 33 (namely, whether the first audio signal undergoes the processing by the HPF 36 or the BEF 38) can be prevented.

A "first volume" that is lower than the threshold value in the embodiments or than the first threshold value in modification 1, and a "second volume" that is higher than the threshold value in the embodiments or than the second threshold value in modification 1, are assumed. The second volume is set to be higher than the first volume. In this case, the low-frequency component adjuster 40 may be understood as an element that adjusts the level of the low-frequency component of the first audio signal such that the level is lowered more (the amount of reduction is greater) in a case where the volume of the first audio signal detected by the first detector 17 is at the second volume, as compared to a case where the volume of the first audio signal is at the first volume. That is, the signal processing controller 18 controls the frequency response of the signal processor 33 by causing the signal processor 33 to operate in the first state when the volume of the first audio signal is at the first volume, and to operate in the second state when the volume of the first audio signal is at the second volume.

In the above description, an exemplary configuration is shown in which the frequency response of the signal processor 33 is changed by switching between whether the processing by the HPF 36 (or the BEF 38) is performed on the first audio signal depending on the volume of the first audio signal. However, the invention is not limited to this example. For example, the signal processor 33 may include the second processing path alone, and the first audio signal may undergo the processing by the HPF 36 (or the BEF 38) regardless of the volume of the first audio signal. In this case, when the volume of the first audio signal is higher than the threshold value, the frequency response of the HPF 36 (or the BEF 38) is changed. Here, such change may be made by an increase in the steepness of a slope indicating the frequency response of the HPF 36 (or the BEF 38), which increase resulting from an increase in the degree of a polynomial equation indicating the frequency response. Alternatively, change in the frequency response of the HPF 36 (or the BEF 38) may be made by an increase in the cut-off frequency of the filter.

Modification 2

Figure 10:
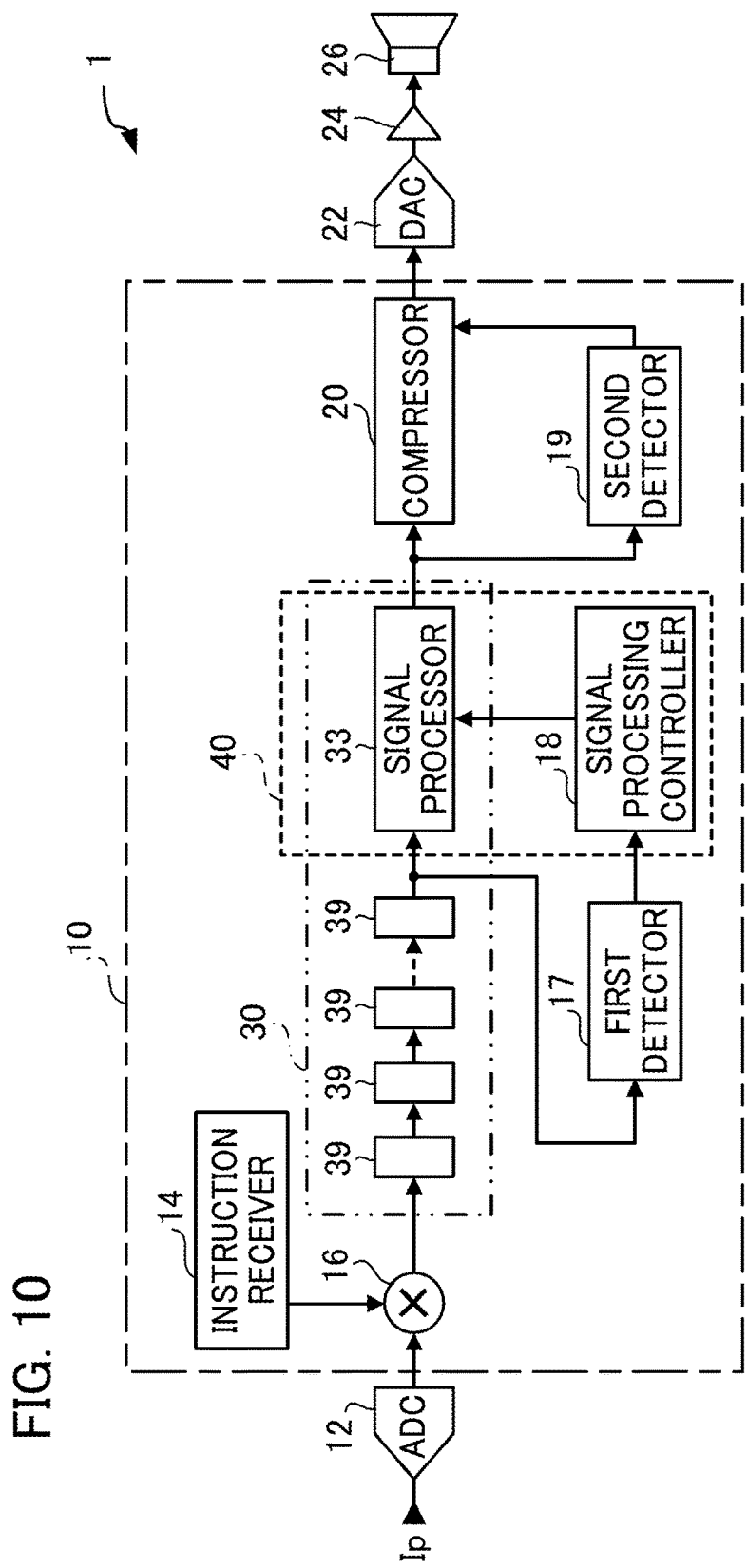
FIG. 10 shows a configuration of a speaker device according to a modification.

In the above embodiments and modification, an exemplary configuration (FIG. 1) is shown in which the first detector 17 detects the volume of the first audio signal before the first audio signal undergoes the processing by the filters 39. However, the first detector 17 may detect the volume of the first audio signal that has undergone the processing by the filters 39. FIG. 10 is a block diagram that shows a configuration of a speaker device 1 in modification 2. As shown in FIG. 10, in modification 2, a first audio signal that has undergone the processing by the filters 39 is provided to the first detector 17.

As described above, in this modification, the first detector 17 detects the volume of the first audio signal whose frequency characteristics have been changed by the filters 39. Thus, in this modification, as compared to the above embodiments and modification, the level of the low-frequency component of the first audio signal can be adjusted based on the volume of an audio signal having frequency characteristics that are closer to the frequency characteristics of an audio signal that is input into the speaker 26. As a result, an advantageous effect of outputting a bass-rich sound regardless of the audio source is even more remarkable in modification 2 than in the above embodiments.

In the above embodiments and modification, an exemplary configuration is shown in which the filters 39 process a first audio signal generated by the multiplier 16. However, in the present modification, after the filters 39 process an input signal, the multiplier 16 may generate a first audio signal from the processed input signal. In other words, the processing by the instruction receiver 14 and by the multiplier 16 may be performed after the processing by the filters 39, so long as such processing is performed before the processing by the first detector 17 and by the signal processor 33.

Modification 3

Figure 11:
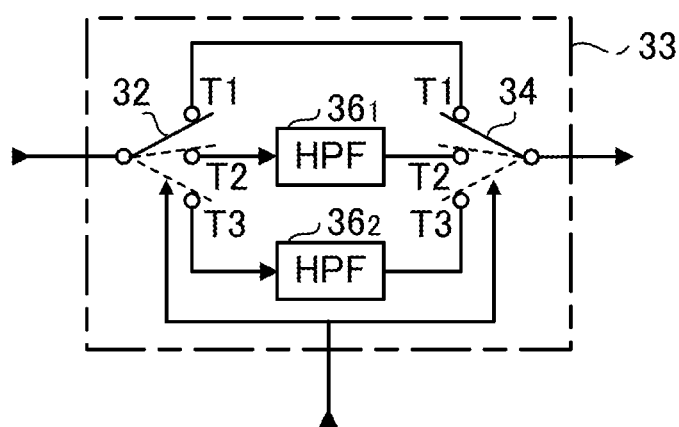
FIG. 11 shows a configuration of a signal processor according to a modification.

In the above embodiments and modifications, an exemplary configuration is shown in which the signal processor 33 includes a single filter (HPF 36 or BEF 38). However, the signal processor 33 may include multiple filters having different frequency responses. FIG. 11 is a block diagram showing an exemplary configuration of a signal processor 33 according to the present modification. In the example shown in FIG. 11, the signal processor 33 includes an HPF $36_1$ (an example of a first filter) and an HPF $36_2$ (an example of a second filter) that have different frequency responses. The HPF $36_2$ lowers the level of the low-frequency component of a first audio signal to a greater degree than the HPF $36_1$. For example, the slope of a line indicating the frequency response of the HPF $36_2$ may be steeper than the slope of a line indicating the frequency response of the HPF $36_1$. In the example shown in FIG. 11, the multiple states in which the signal processor 33 can operate include a third state, in addition to the above-described first and second states. In the second state, the HPF $36_1$ processes a first audio signal to generate a second audio signal. In the third state, the HPF $36_2$ processes a first audio signal to generate a second audio signal. A state in which the signal processor 33 operates is determined by the signal processing controller 18 depending on the volume of the first audio signal. For example, the signal processing controller 18 may cause the signal processor 33 to operate in the third state in a case where the volume is higher than a threshold value ThB, to operate in the second state in a case where the volume is equal to or lower than the threshold value ThB and the volume is higher than a threshold value ThA, and to operate in the first state in other cases. Here, the threshold value ThB is set to be higher than the threshold value ThA.

In the example shown in FIG. 11, the signal processor 33 includes three processing paths: a first processing path (corresponding to the first state) in which the level of the first audio signal is not lowered; a second processing path (corresponding to the second state) in which the first audio signal is processed by the HPF $36_1$; and a third processing path (corresponding to the third state) in which the first audio signal is processed by the HPF $36_2$. By selecting one of these three processing paths, the signal processing controller 18 controls the frequency response of the signal processor 33.

In the example shown in FIG. 11, the switches 32 and 34 each have a common connection terminal, a terminal T1, a terminal T2, and a terminal T3. The HPF $36_1$ and $36_2$ each have an input terminal and an output terminal. The terminal T1 of the switch 32 is connected to the terminal T1 of the switch 34. The terminal T2 of the switch 32 is connected to the input terminal of the HPF $36_1$, and the terminal T2 of the switch 34 is connected to the output terminal of the HPF $36_1$. The terminal T3 of the switch 32 is connected to the input terminal of the HPF $36_2$, and the terminal T3 of the switch 34 is connected to the output terminal of the HPF $36_2$. In the first state, the signal processing controller 18 causes the switches 32 and 34 to select their respective terminals T1. In the second state, the signal processing controller 18 causes the switches 32 and 34 to select their respective terminals T2. In the third state, the signal processing controller 18 causes the switches 32 and 34 to select their respective terminals T3.

In the present modification, because the signal processor 33 includes two HPF 36, depending on the volume of the first audio signal, the frequency response of the signal processor 33 (i.e., the degree of reduction in the level of the low-frequency component) can be changed in three stages. Since the degree of reduction is changed in three stages in modification 3, compared with a case where the degree of reduction is changed in two stages, the change in the degree of reduction between neighboring two stages is smaller. Thus, noise can be reduced that is generated when the degree of reduction in the level of the low-frequency component is changed. As a result, the change in the frequency response of the signal processor 33, that is, the switching between the processing paths included in the signal processor 33, is not readily perceivable by the user.

In the above example, the signal processor 33 includes two HPF 36. However, the signal processor 33 may include three or more HPF 36. Moreover, in the above example, the signal processor 33 includes multiple HPF 36. However, the signal processor 33 may include multiple BEF 38, instead of multiple HPF 36.

Modification 4

In the above embodiments and modifications, an exemplary configuration is shown in which the signal processor 33 includes the switches 32 and 34 (FIG. 2, FIG. 7, and FIG. 11). However, the signal processor 33 need not include the switch 32. In a case where the signal processor 33 does not include the switch 32, an output terminal of the last filter 39 among the filters 39, which are connected in series, is connected to the input terminal(s) of the (multiple) HPF 36 and to the terminal T1 of the switch 34. As a result of the switch 34 switching the selection between the terminal T1 and the terminal T2 (and the terminal T3) in accordance with the signal provided by the signal processing controller 18, the state of the signal processor 33 is switched between the first state and the second state (and the third state).

Modification 5

In the above embodiments and modifications, an exemplary configuration is shown in which the frequency response of the signal processor 33 is switched in a stepwise manner by the switches 32 and 34. However, the present invention is not limited to the above example. The frequency response of the signal processor 33 may be changed in a continuous manner. For example, the signal processor 33 may generate a second audio signal by cross-fading between an audio signal that is not processed by the HPF 36 or the BEF 38 (i.e., a first audio signal provided to the signal processor 33) and an audio signal that is generated by lowering of the level of the low-frequency component of the first audio signal. More specifically, a first audio signal (referred to as a first-path audio signal) that has passed through the first processing path included in the signal processor 33, and a first audio signal (referred to as a second-path audio signal) that has passed through the second processing path included in the signal processor 33, are assumed. The signal processor 33 generates a second audio signal by adding up an audio signal that is generated by decreasing, over time, the volume of the first-path audio signal and an audio signal that is generated by increasing, over time, the volume of the second-path audio signal such that these two generated audio signals are partially superimposed on each other.

Similarly, in a configuration of the above modification 3, a first audio signal (referred to as a third-path audio signal) that has passed through the third processing path included in the signal processor 33 is assumed. The signal processor 33 may cross-fade between a second-path audio signal having passed through the second processing path and a third-path audio signal having passed through the third processing path to generate a second audio signal.

In the present modification, because the frequency response of the signal processor 33 is changed in a continuous manner, compared with a case where the frequency response is changed in a stepwise manner, the degree of reduction in the level of the low-frequency component changes smoothly. Thus, noise that is generated when the degree of reduction in the level of the low-frequency component changes is reduced. As a result, the change in the frequency response of the signal processor 33 is not readily perceivable by the user.

The following modes may be understood from at least one of the above-described embodiments and modifications.

An audio device according to a preferred mode of the invention includes: a first detector configured to detect a volume of a first audio signal; and a low-frequency component adjuster configured to generate a second audio signal in which a level of a low-frequency component of the first audio signal is adjusted based on the volume detected by the first detector. By this configuration, there can be generated the second audio signal in which the level of the low-frequency component is appropriately adjusted based on the volume of the first audio signal.

Preferably, the low-frequency component adjuster adjusts the level of the low-frequency component of the first audio signal such that, compared to a case where the volume is at a first volume, the level of the low-frequency component of the first audio signal is lowered more in a case where the volume is at a second volume. Here, the second volume is higher than the first volume. By this configuration, even when the volume of the first audio signal changes from the second volume to the first volume, a bass-rich sound can be output.

Preferably, the low-frequency component adjuster includes: a signal processor configured to generate the second audio signal in which the level of the low-frequency component of the first audio signal is adjusted; and a signal processing controller configured to control a frequency response of the signal processor based on the volume.

Preferably, the signal processor operates in one of multiple states that include a first state and a second state, wherein in the first state, the level of the low-frequency component of the first audio signal is not lowered, and in the second state, the level of the low-frequency component of the first audio signal is lowered. The signal processing controller controls the frequency response of the signal processor by causing the signal processor to operate in the first state when the volume is at the first volume, and to operate in the second state when the volume is at the second volume.

Preferably, the signal processor includes a high-pass filter or a band-elimination filter that lowers the level of the low-frequency component of the first audio signal.

Preferably, the signal processor includes a first filter and a second filter that have different frequency responses. In the second state, the first filter processes the first audio signal to generate the second audio signal. The multiple states further include a third state in which the second filter processes the first audio signal to generate the second audio signal. By this configuration, the frequency response of the signal processor is changed in at least three stages. Thus, compared with a case where the frequency response is changed in two stages, when the degree of reduction in the level of the low-frequency component of the first audio signal is changed from one stage to a neighboring stage, the change in the degree of reduction is reduced.

Preferably, the first detector detects, as the volume, a maximum value of an amplitude of the first audio signal over a unit period. By this configuration, compared with a case where, for example, each of amplitudes displayed by the first audio signal is detected as the volume, a number of times of adjusting the level of the low-frequency component of the first audio signal is reduced.

Preferably, the signal processor generates the second audio signal in which the first audio signal and an audio signal generated by lowering of the level of the low-frequency component of the first audio signal are cross-faded. By this configuration, the frequency response of the signal processor is changed in a continuous manner. Accordingly, compared with a case where the frequency response of the signal processor is changed in a stepwise manner, the degree of reduction in the level of the low-frequency component of the first audio signal changes smoothly.

Preferably, the audio device further includes a compressor configured to compress a dynamic range of the second audio signal in accordance with a level of the second audio signal. By this configuration, compared with a case where the dynamic range is not compressed, an incidence of clipping of the signal is reduced. As a result, distortion in output sound is minimized.

In this configuration, the audio device may further include a second detector configured to detect a volume of the second audio signal, and the compressor compresses the dynamic range of the second audio signal in accordance with the volume detected by the second detector.

Preferably, the audio device further includes: an instruction receiver configured to receive an instruction to set a volume of the first audio signal; and a signal generator configured to generate the first audio signal in which a volume of an input signal is adjusted in accordance with the instruction.

The present invention may be understood as an audio signal processing method executed in any of the audio devices in the above-described modes, or as a speaker device that includes any of the above-described audio devices and a sound output device.

DESCRIPTION OF REFERENCE SIGNS

1 . . . speaker device; 14 . . . instruction receiver; 16 . . . multiplier; 17 . . . first detector; 18 . . . signal processing controller; 19 . . . second detector; 20 . . . compressor; 26 . . . speaker; 33 . . . signal processor; 36 . . . HPF (high-pass filter); 38 . . . BEF (band-elimination filter); 30 . . . equalizer; and 40 . . . low-frequency component adjuster.

What is claimed is:

1. An audio device comprising:
    a user interface that receives a user instruction to set a volume of an input signal;
    a volume control circuit that generates a first audio signal obtained by adjusting the volume of the input signal in accordance with the user instruction;
    filters that change frequency characteristics of the first audio signal;
    a first detecting circuit that detects a volume of the first audio signal where the frequency characteristics thereof have been changed by the filters; and
    a low-frequency component adjusting circuit that generates a second audio signal by:
        lowering a level of a low-frequency component of the first audio signal in a case where the volume detected by the first detecting circuit exceeds a first predetermined threshold; and
        without lowering the level of the low-frequency component of the first audio signal in a case where the volume detected by the first detecting circuit does not exceed the first predetermined threshold.

2. The audio device according to claim 1, wherein the low-frequency component adjusting circuit includes a high-pass filter that lowers the level of the low-frequency component of the first audio signal.

3. The audio device according to claim 1, wherein the low-frequency component adjusting circuit includes a band-elimination filter that lowers the level of the low-frequency component of the first audio signal.

4. The audio device according to claim 1, wherein:
    the low-frequency component adjusting circuit includes a first filter and a second filter that have different frequency responses,
    in a case where the volume detected by the first detecting circuit exceeds the first predetermined threshold but does not exceed a second predetermined threshold that is higher than the first predetermined threshold, the first filter processes the first audio signal to generate the second audio signal, and
    in a case where the volume detected by the first detecting circuit exceeds the second predetermined threshold, the second filter processes the first audio signal to generate the second audio signal.

5. The audio device according to claim 1, wherein the first detecting circuit detects, as the volume, a maximum value of an amplitude of the first audio signal over a unit period.

6. The audio device according to claim 1, wherein the low-frequency component adjusting circuit generates the second audio signal by cross fading the audio signal with the first audio signal with the level of the low-frequency component thereof having been lowered.

7. The audio device according to claim 1, further comprising a compressing circuit that compresses a dynamic range of the second audio signal in accordance with a level of the second audio signal.

8. The audio device according to claim 7, further comprising:
    a second detecting circuit that detects a volume of the second audio signal,
    wherein the compressing circuit compresses the dynamic range in accordance with the volume detected by the second detecting circuit.

9. A speaker device comprising:
    an audio device comprising;
        a user interface that receives a user instruction to set a volume of an input signal;
        a volume control circuit that generates a first audio signal obtained by adjusting the volume of the input signal in accordance with the user instruction;
        filters that change frequency characteristics of the first audio signal;
        a first detecting circuit that detects a volume of the first audio signal where the frequency characteristics thereof have been changed by the filters; and
        a low-frequency component adjusting circuit that generates a second audio signal by:
            lowering a level of a low-frequency component of the first audio signal in a case where the volume detected by the first detecting circuit exceeds a predetermined threshold; and
            without lowering the level of the low-frequency component of the first audio signal in a case where the volume detected by the first detecting circuit does not exceed the first predetermined threshold; and
    at least one speaker that emits sound based on the second audio signal.

10. An audio signal processing method comprising:
    receiving an instruction to set a volume of an input signal;
    generating a first audio signal obtained by adjusting the volume of the input signal in accordance with a user instruction;
    changing frequency characteristics of the first audio signal;
    detecting a volume of the first audio signal where the frequency characteristics thereof have been changed; and
    generating a second audio signal by:
        lowering a level of a low-frequency component of the first audio signal in a case where the detected volume of the first audio signal exceeds a first predetermined threshold; and
        without lowering the level of the low-frequency component of the first audio signal in a case where the detected volume of the first audio signal does not exceed the first predetermined threshold.

11. The audio device according to claim 1, wherein the low-frequency component adjusting circuit includes at least one filter and a comparator.

12. The audio signal processing method according to claim 10, wherein the generating of the second audio signal uses a low-frequency component adjusting circuit that includes a high-pass filter that lowers the level of the low-frequency component of the first audio signal.

13. The audio signal processing method according to claim 10, wherein the generating of the second audio signal uses a low-frequency component adjusting circuit that includes a band-elimination filter that lowers the level of the low-frequency component of the first audio signal.

14. The audio signal processing method according to claim 10, wherein:
the generating of the second audio signal uses a low-frequency component adjusting circuit that includes a first filter and a second filter that have different frequency responses,
the detecting of the volume of the first audio signal uses a detecting circuit,
in a case where the detected volume exceeds the first predetermined threshold but does not exceed a second predetermined threshold that is higher than the first predetermined threshold, the generating of the second audio signal filters the first audio signal using the first filter to generate the second audio signal, and
in a case where the detected volume exceeds the second predetermined threshold, the generating of the second audio signal filters the first audio signal using the second filter to generate the second audio signal.

15. The audio signal processing method according to claim 10, wherein:
the detecting of the volume of the first audio signal uses a detecting circuit, and
the detecting circuit detects, as the volume, a maximum value of an amplitude of the first audio signal over a unit period.

16. The audio signal processing method according to claim 10, wherein:
the generating of the second audio signal uses a low-frequency component adjusting circuit, and
the low-frequency component adjusting circuit generates the second audio signal by cross fading the audio signal with the first audio signal with the level of the low-frequency component thereof having been lowered.

17. The audio signal processing method according to claim 10, further comprising compressing, using a compressing circuit, a dynamic range of the second audio signal in accordance with a level of the second audio signal.

18. The audio signal processing method according to claim 17, further comprising:
detecting a volume of the second audio signal using a detecting circuit,
wherein the compressing circuit compresses the dynamic range in accordance with the volume detected by the second detecting circuit.

19. The audio signal processing method according to claim 10, wherein the generating of the second audio signal uses a low-frequency component adjusting circuit that includes at least one filter and a comparator.

* * * * *